United States Patent [19]
Krahn

[11] Patent Number: 5,351,028
[45] Date of Patent: Sep. 27, 1994

[54] MAGNETORESISTIVE PROXIMITY SENSOR

[75] Inventor: Donald R. Krahn, Eagan, Minn.

[73] Assignee: Honeywell Inc., Minneapolis, Minn.

[21] Appl. No.: 76,511

[22] Filed: Jun. 14, 1993

[51] Int. Cl.$^5$ .................................... H01L 43/08
[52] U.S. Cl. ............................ 338/32 R; 324/207.21
[58] Field of Search .................. 338/32 R, 32 H; 324/207.21, 252

[56] References Cited
U.S. PATENT DOCUMENTS 4,506,211 3/1985 Rothley et al. ................ 324/207.21
4,712,064 12/1987 Eckardt et al. ..................... 324/208
4,725,776 2/1988 Onodera et al. .................... 324/208
4,853,632 8/1989 Nagano et al. ................ 338/32 R X
5,038,130 8/1991 Eck et al. ......................... 338/32 R
5,041,784 8/1991 Griebeler ....................... 324/207.21

*Primary Examiner*—Marvin M. Lateef

[57] ABSTRACT

A proximity sensor which has planar magnetoresistive elements lying in the plane of a radial magnetic field. The magnetoresistive elements arranged in a bridge configuration and are magnetically saturated by the radial magnetic field. The proximity sensor detects the approach of a ferromagnetic object by detecting movement of the effective center of the radial magnetic field.

10 Claims, 8 Drawing Sheets

MAGNETORESISTIVE PROXIMITY SENSOR

BACKGROUND OF THE INVENTION

The present invention relates generally to proximity sensors and particularly to proximity sensors based on sensing changes in a radial magnetic field in the plane of the sensing element.

There has been, and continues to be, a need to do better magnetic detection of the location or proximity of a ferromagnetic object relative to a magnetic sensor. The need exists in a variety of commercial, industrial and automotive applications.

The need for better position sensing is especially great in applications requiring the sensing of the motion of the teeth on a gear which are moving near the end of a probe type sensor. These needs include, for example automotive sensing applications such as engine cams and anti lock braking systems.

A number of proximity sensing devices based on magnetic sensing have been utilized in the past. Variable reluctance sensors (VRS) have been used in which the motion of gear teeth causes the net flux from a permanent magnet to create a voltage in a coil wrapped around the magnet. For lower gear teeth speeds the voltage generated is too small to be detected above the ambient noise.

Magnetoresistive sensors have been proposed which have a single magnetic sensitive axis. These are used in conjunction with a permanent magnet to provide a magnetic field which is then modulated by the position of the ferromagnetic object, e.g., the gear teeth moving nearby.

Hall type magnetic sensors which include a permanent magnet and a Hall effect transducer have been used in gear tooth sensing applications. When a gear tooth is not near the transducer face a fixed level of magnetic field is detected by the transducer. When any tooth is moved into proximity to the sensor, the tooth acts as a flux concentrator to increase the field detected. This increase in the detected field relative to the fixed level is small and this results in a very low level output signal.

Thus a need exists for a proximity sensor which has a larger output signal level than past proximity sensors and that has an output signal level that is independent of the frequency at which gear teeth pass the sensor

SUMMARY OF THE INVENTION

The present invention solves these and other needs by providing an apparatus for detecting the position of a ferromagnetic object. A magnetic field source produces a radial magnetic field component perpendicular to the axis of the source. A magnetoresistive transducer lies between the magnetic field source and the ferromagnetic object and in the plane of the radial magnetic field. The transducer senses perturbations of the radial magnetic field that lies in the plane of the transducer.

BRIEF DESCRIPTION OF THE DRAWINGS

FIGS. 8a and 8b show alternative construction for a portion of the apparatus of FIG. 1.

DETAILED DESCRIPTION

Figure 1:
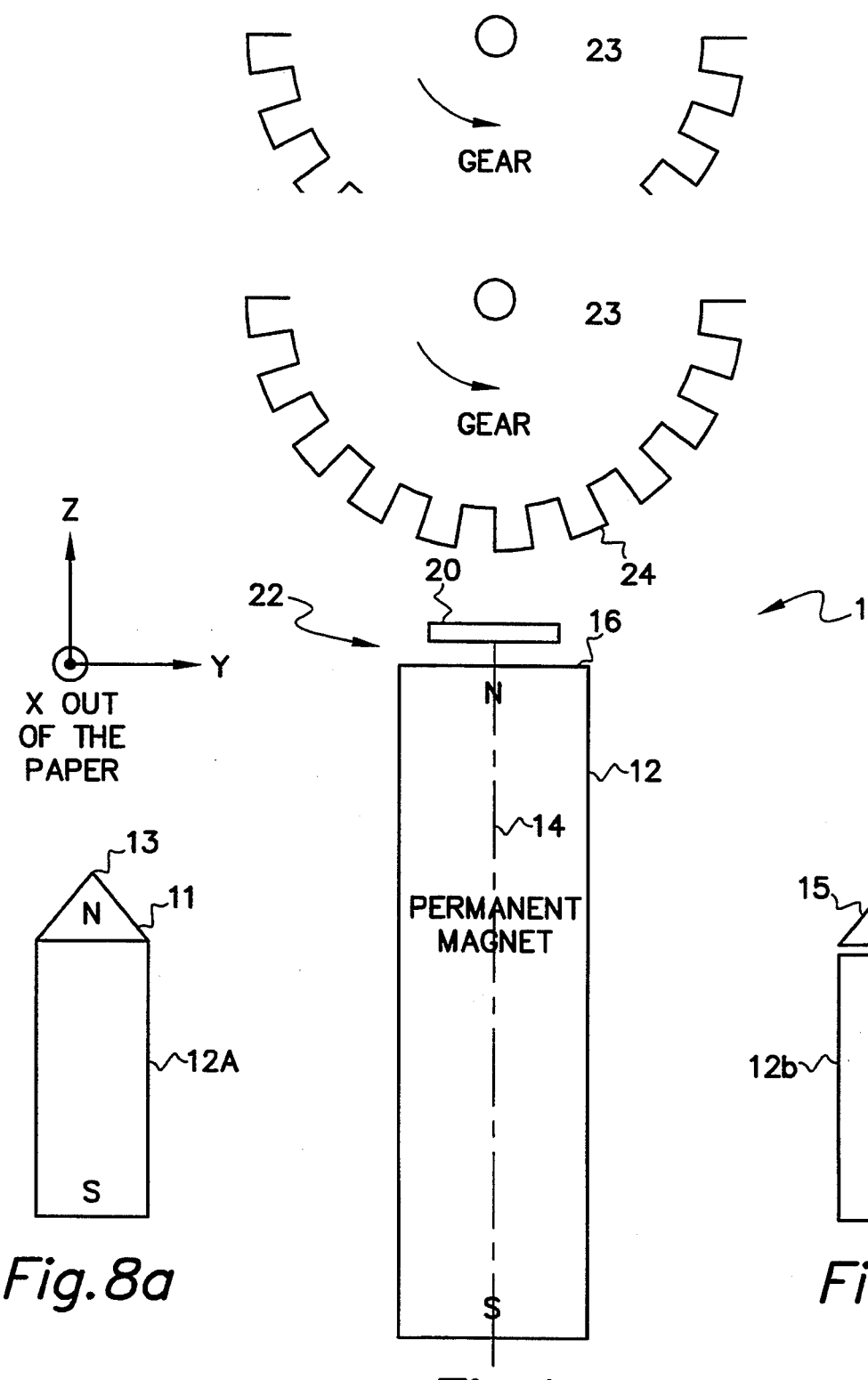
FIG. 1 shows an elevation view of a proximity sensor for use in sensing gear tooth position according to the teachings of the present invention.
Figure 2:
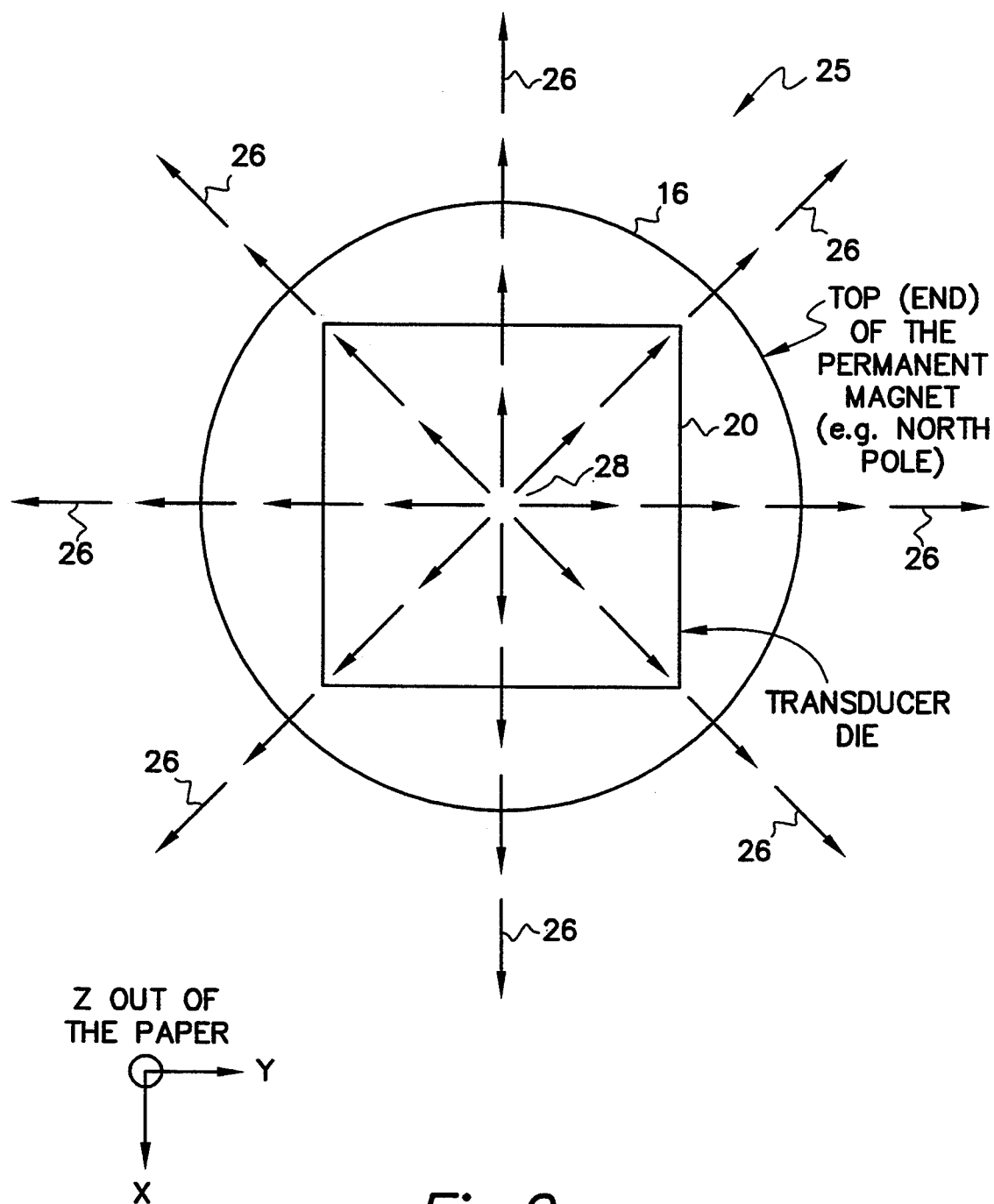
FIG. 2 is a plan view of the proximity sensor of FIG. 1.

An apparatus for sensing the proximity of a ferromagnetic object is shown in the drawings and generally designated 10. The overall physical arrangement of the present invention is shown in FIG. 1 and includes permanent magnet 12 having an axis 14 and a pole face 16. Permanent magnet 12 provides a nominal dipole magnetic field. Magnetoresistive transducer 20 is of planar construction and is located in a plane lying perpendicular to axis 14 and parallel to face 16 of magnet 12. U.S. Pat. No. 4,847,584 dated Jul. 11, 1989 and assigned to the same assignee as the present application contains certain information relative to the construction of magnetic field sensors from magnetoresistive material and is hereby incorporated by reference. The combination of magnet 12 and transducer 20 make up a probe style sensor 22 which is positioned relative to ferromagnetic gear teeth 24 located on gear 23 such that gear teeth 24 perturb the magnetic field produced by the permanent magnet. Note that so far this overall geometry is similar to the variable reluctance sensor (VRS) approach. As shown in FIG. 1, the magnetoresistive transducer 20 is placed between the end of permanent magnet 12 and gear teeth 24. Transducer 20 is placed such that the plane of the die is coplanar with the end or face 16 of magnet 12 and perpendicular to axis 14. With this geometry, the in-plane magnetic field, i.e. the magnetic field in the plane of the transducer die is radial. FIG. 2 is a plan view of end 16 of permanent magnet 12 and a diagrammatic representation of vectors 26 showing the radial orientation of the magnetic field in the plane of transducer die 20, i.e., the x-y plane due to permanent magnet 12 located below transducer die 20. This magnetic field represented by vector 26 has an effective center or epicenter 28. It is noted that this overall geometry of permanent magnet 12, transducer die 20, and gear teeth 24 is the same as that used for many Hall effect sensors. However, note that the present invention makes use of the magnetic field component in the plane of the transducer die 20 and not the magnetic field component perpendicular to transducer die 20. In particular this invention makes use of the nominal radial in-plane magnetic field represented by vectors 26 in FIG. 2. While permanent magnet 12 is shown producing the magnetic field, other means such as a current in a coil of wire could be used.

Figure 3B:
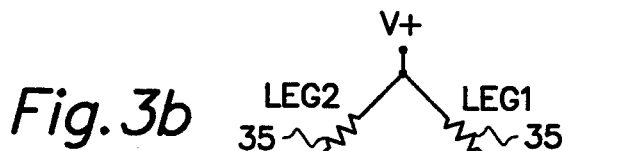
FIG. 3b is an equivalent electric layout.
Figure 3A:
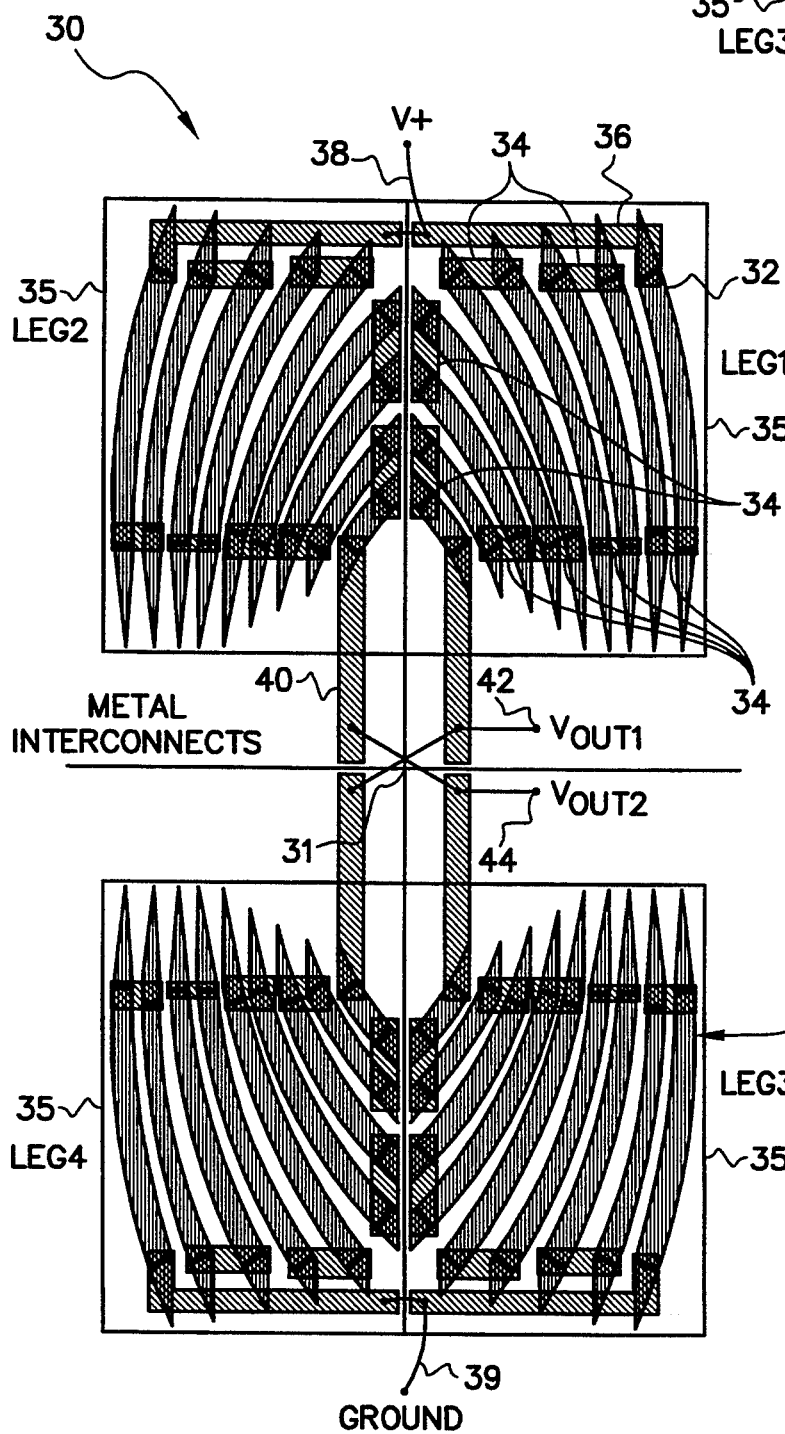
FIG. 3a is a plan view of a physical layout for the magnetoresistive sensing element of the proximity sensor of FIG. 1
Figure 4:
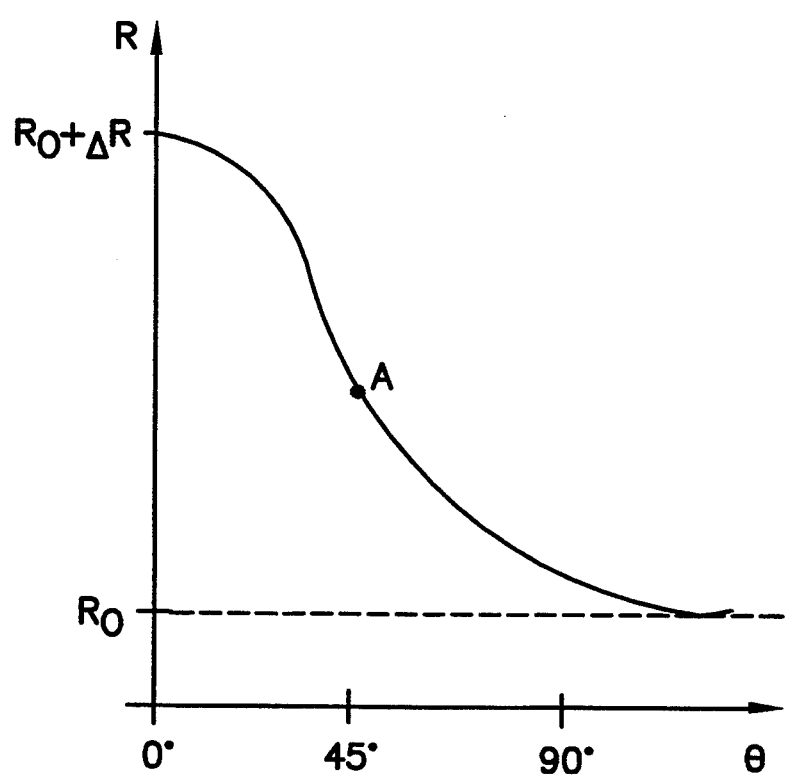
FIG. 4 is an illustration of the approximate resistance of a magnetoresistive material as a function of the angle between the magnetization vector and the current flow in one strip of magnetoresistive material.

The details for one construction layout of transducer die 20 according to the principles of the present invention are shown in FIGS. 3a and 3b. The magnetoresistive transducer arrangement shown is a four leg Wheatstone bridge 30 which includes leg 1, leg 2, leg 3, and leg 4. A voltage is applied at terminal 38 and terminal 39 and an output voltage is available between terminal 42 and terminal 44. Each of legs 1–4 is a magnetoresistive element 35 and is made up of a plurality of strips 32 of magnetoresistive material which for purposes of this description will be referred to as Ni/Fe or permalloy although it is understood that other magnetoresistive materials could be used. Interconnections 34 connect strips 32, for example, within leg 1, into an electrical series string which forms leg 1. Conductor 36 brings one end of leg 1 to a convenient location for connection to leg 2 and to a positive voltage source 38 and conductor 40 brings the other end of leg 1 to a convenient location for electrical connection to an output terminal 42 and to leg 4. The layout of legs 1–4 according to the teaching of the present invention is such that there is a physical center 31 with legs 1–4 spaced from and symmetrically located around physical center 31 as shown in FIG. 3a. FIG. 3b shows an equivalent electrical layout for bridge 30. Each leg of the bridge as shown is made of one or more permalloy strips, for example nine strips are shown, which are arranged such that each segment of each strip is oriented at a nominal angle of 45 degrees with respect to the in-plane radial magnetic field lines which emanate from the center or epicenter 28 of transducer die 20. If these radial magnetic field components are sufficient to magnetically saturate, or nearly saturate, NiFe/permalloy thin film strips 32, then the magnetization direction in these NiFe/permalloy elements will be nominally along the direction of this saturating magnetic field and will be aligned at a nominal angle of 45 degrees with respect to the current flow in the strip at each point along the strip. The resistance, R, of the permalloy or other magnetoresistive material strip is given by $$R = Ro + \Delta R \cos^2\theta \tag{1}$$

where $\theta$ is the angle between the magnetization vector in the magnetoresistive material and the direction of the electrical current flow in the material, $\Delta R$ is the amount of resistance change as the magnetization vector is rotated from being parallel to the strip to being perpendicular to the strip, and Ro is the resistance of the strip when $\theta$ is ninety degrees. This relationship is illustrated in FIG. 4. The nominal forty-five degree angle for $\theta$, which is established by the construction of the present invention, puts each leg of Wheatstone bridge 30 approximately as shown by point A in FIG. 4. Thus Wheatstone bridge 30 will be nominally balanced when the effective center 28 of the radial magnetic field pattern, in the plane of the transducer die, is located at the physical center 31 of the four leg array.

Apparatus 10 has been described in terms of a four leg Wheatstone bridge configuration where magnetoresistive strips 32 made up each of legs 1–4. It is to be understood that apparatus 10 could be constructed using only two legs made up of magnetoresistive strips and constant current sources to provide an electric bridge arrangement. This two leg bridge would provide an output signal related to differences in the resistance of the two bridge legs. For example, referring to FIG. 3a, a two leg bridge could use leg 1 and leg 2 in the physical positions shown in FIG. 3a along with constant current sources in place of a voltage source.

It is noted that curved magnetoresistive strips 32 as shown in FIG. 3a are actually made up of a series of 0 straight segments. According to the principles of the present invention strips 32 may be also be smoothly curved strips or straight strips. When straight strips are used they should be oriented along the approximate, or average orientation directions of the strips shown in FIG. 3a. Note that using straight, i.e., non-curved, strips will reduce the bridge output slightly, due to some of the portions of the strip not being oriented at 45 degrees to the radial magnetic field, but these may be more than adequate for many sensing applications.

Figure 5A:
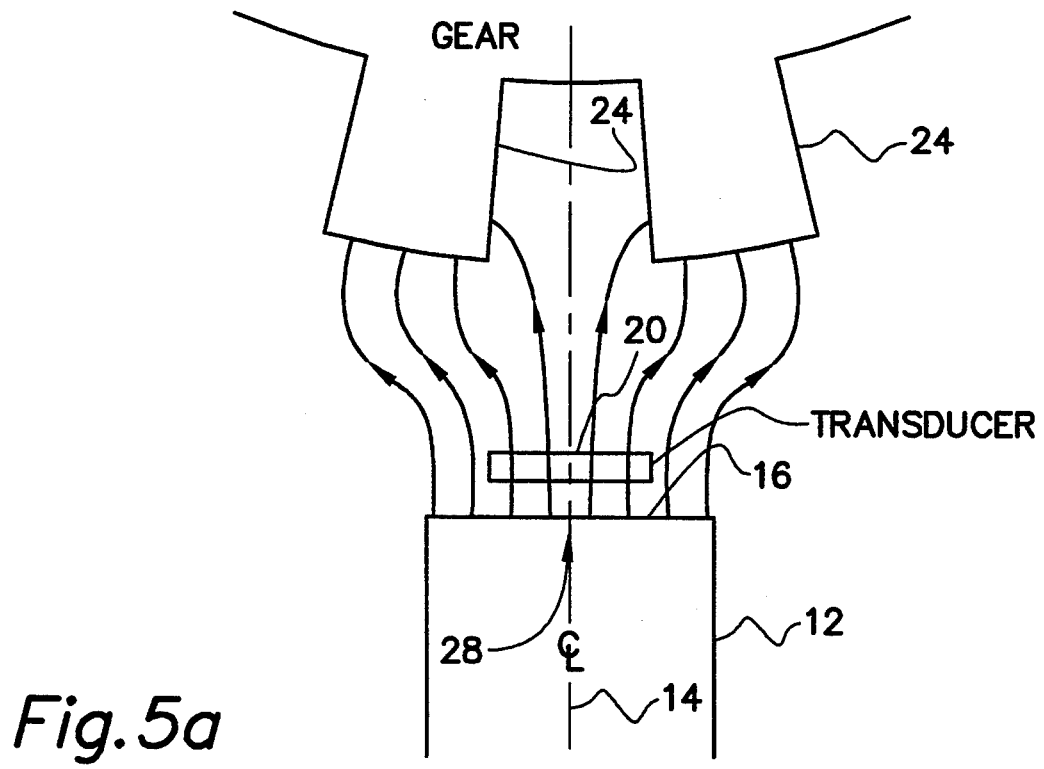
FIGS. 5a and 5b are partial elevation views of the proximity sensor.
Figure 5B:
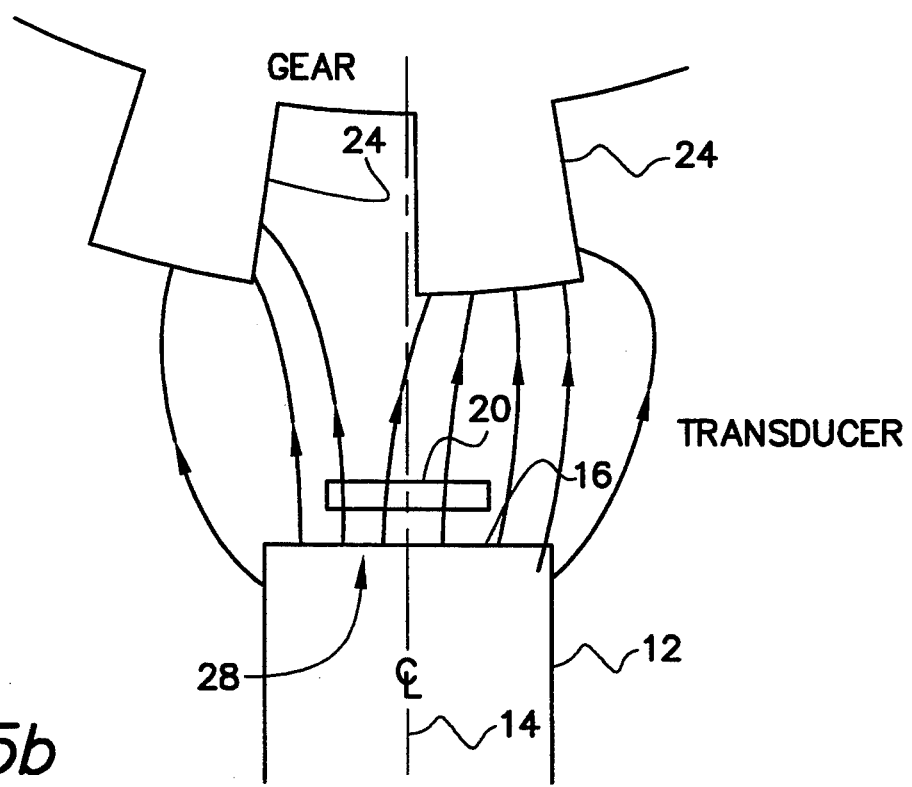

Referring now to the physical orientation of the present invention shown in FIG. 1, gear teeth 24 moving near the end or face 16 of permanent magnet 12 will perturb, or move the effective center 28 of the in-plane radial magnetic field 25 to the right and to the left of the nominal center position. This perturbing effect is shown in the side views in FIGS. 5a and 5b. In FIG. 5a the centerline or axis of magnet 12 is located at a mid-point of two gear teeth 24. For this symmetric arrangement, effective center 28 of radial magnetic field 25 will lie on the axis 14 of magnet 12 and bridge 30 will be nominally balanced. FIG. 5b illustrates a different position of gear teeth 24. For this nonsymmetric arrangement, the unequal number of magnetic field lines passing through gear teeth 24 causes effective center 28 to move to the left with respect to axis 14.

Figure 6A:
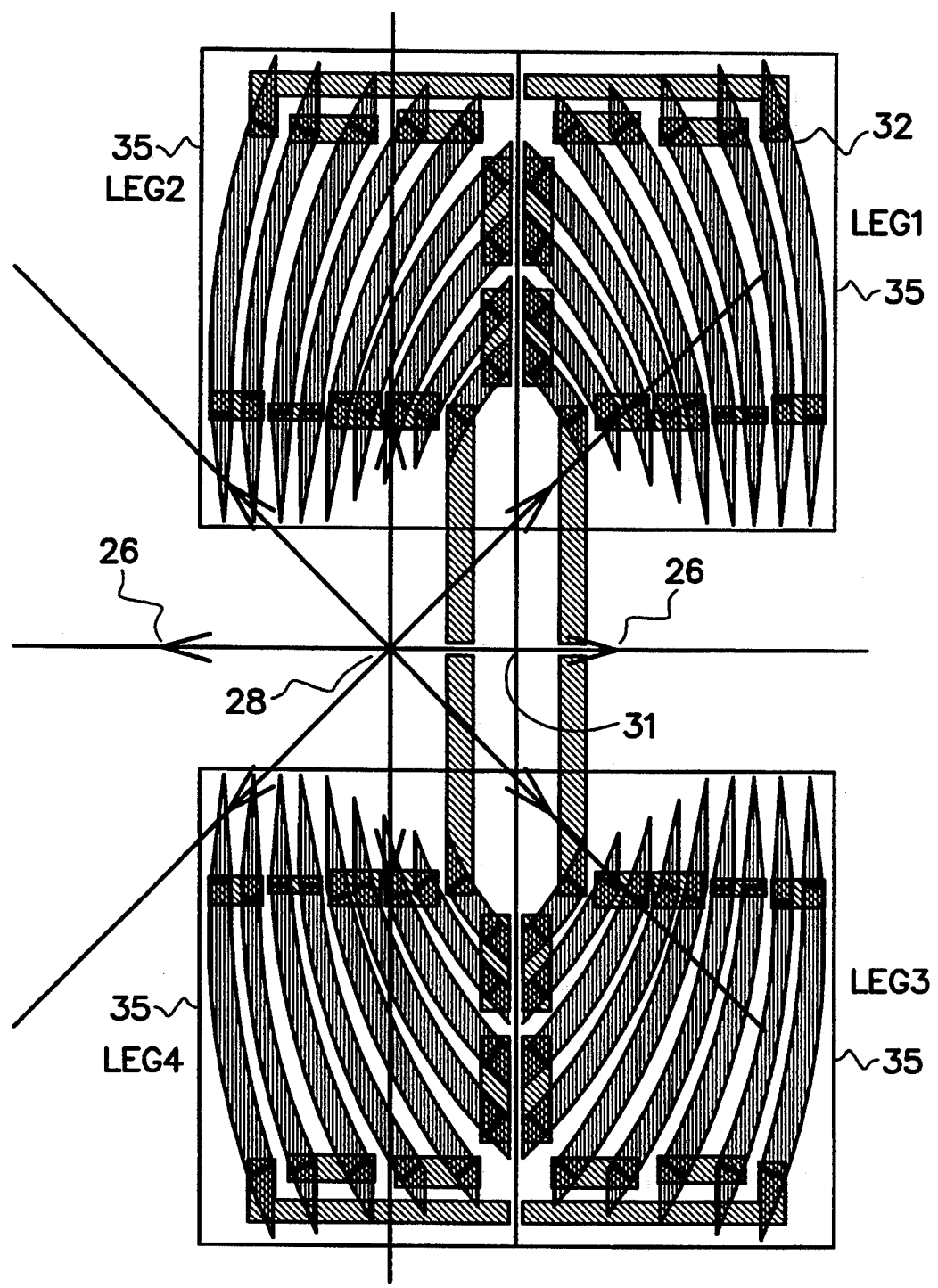
FIGS. 6a and 6b are diagrammatic representations of the radial magnetic field for different gear tooth positions.
Figure 6B:
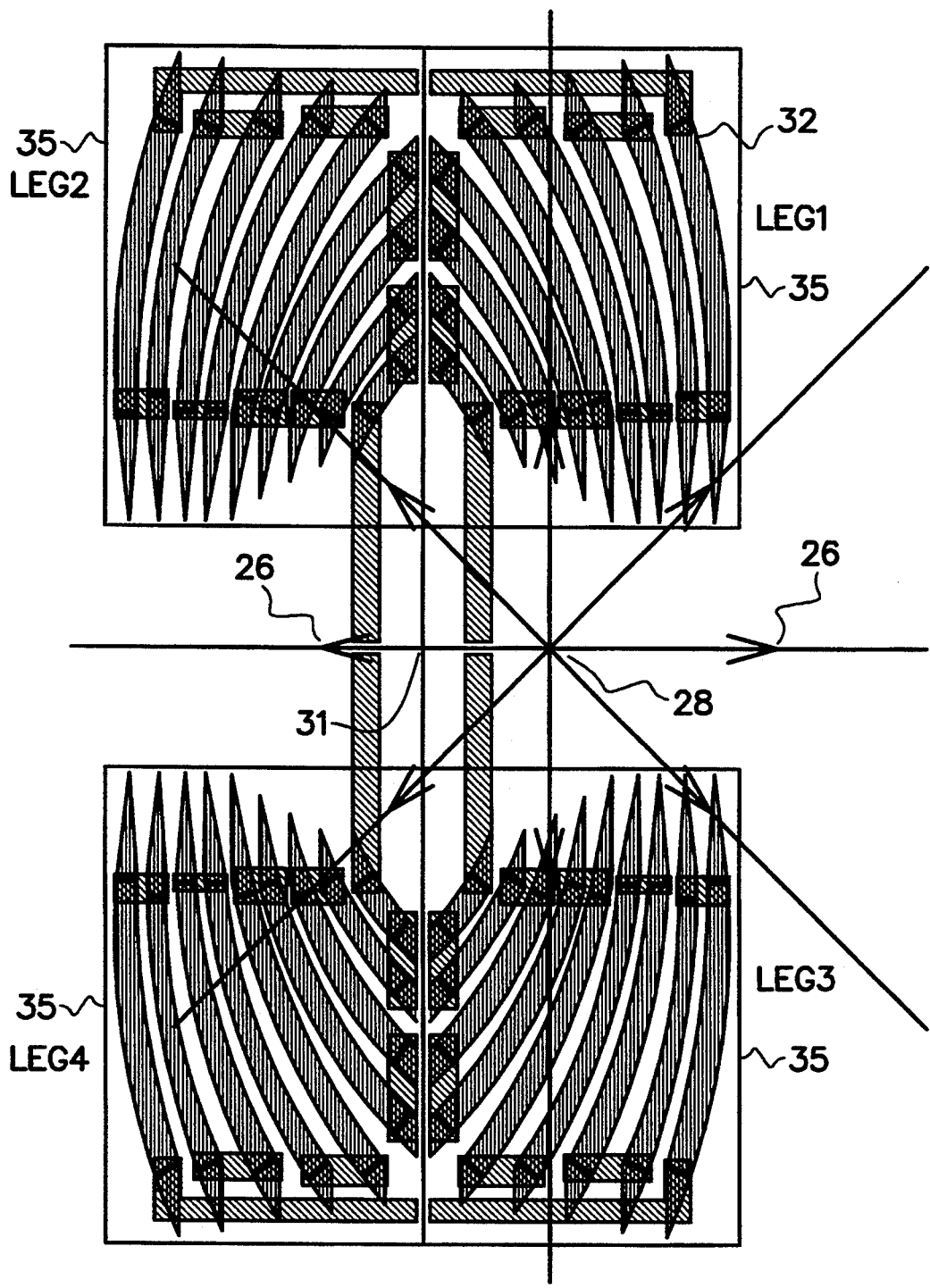

FIGS. 6a and 6b show the effective center 28 of the in-plane radial field 25 being moved to the left and to the right respectively in the plane of transducer die 20. Electrical connections are not shown in FIGS. 6a and 6b. Note in FIG. 6a, with the effective center of the nominally radial field moved to the left, that the angle, $\theta$, between the magnetization vector and the electrical current in the NiFe/permalloy strips in legs 1 and 3 will be increased while the angle, $\theta$, between the magnetization vector and the electrical current in the NiFe/permalloy strips in legs 2 and 4 will be decreased. This unbalances bridge 30 providing an electrical output from bridge 30. When the effective center of the nominally radial field moves to the right the opposite shifts in $\theta$ occur in the four legs of the bridge providing an output signal with the opposite polarity. Thus a bipolar output signal will be obtained as the gear teeth successively move past the sensor. The shape of this output voltage as a function of the motion of the teeth will depend upon the geometric and magnetic design details of both the sensor and the gear teeth. In fact, if desired, these shapes and material properties can be selected to provide a specific output waveform for those applications which may require it.

Magnetoresistive strips 32 for apparatus 10 are to be of a magnetoresistive material and of a thinness such that when subjected to the radial magnetic field provided by permanent magnet 12, strips 32 will be saturated. When saturated, the magnitude of the radial field is such that it causes the magnetization in the strips 32 to point along the direction of the radial magnetic field, i.e., along the direction of vector 26. Relative to the magnetization curve or B-H curve, the material of magnetoresistive strip 32 is operating in the saturated region of the B-H curve. Under these saturated conditions, when a ferrous object perturbs the radial magnetic field it causes movement of effective center 28 which causes a change in the angle $\theta$. The change in resistance R of this magnetoresistive strip 32 is substantially due to the $\Delta R \cos^2\theta$ term of equation 1 and it is the change in resistance of the legs of bridge 30 that causes an output signal. Therefore the output signal from bridge 30 is representative of changes in the angle $\theta$ for each of legs 1–4 due to movement of epicenter 28 and is generally insensitive to variations in the magnitude of radial field component 26. The construction of bridge 30 as shown in the FIGS. provides a balanced bridge condition when epicenter 28 is located at physical 0 center 31 of bridge 30.

It is preferable that movement of the effective center 28 of the in plane magnetic field 26 occur in a region where there are no magnetoresistive elements. The reason for this is because the in plane field 26 at the effective center 28 is zero and would not cause the magnetization of the elements to be saturated in that region. This would tend to increase the observed noise level from those magnetoresistive elements which are not magnetically saturated. This increased noise level may be acceptable for certain applications.

The form of permanent magnet 12 may be varied from what is illustrated in FIG. 1. For example, as shown in FIG. 8a, magnet 12a has a tapered portion 11 which terminates in a point 13 to enhance the magnitude of the radial in plane magnetic field. Another variation of the permanent magnet is shown in FIG. 8b where a flux concentrator 15 of a soft ferrous material i is held in place at the end of permanent magnet 12b.

In actual implementation of the present invention, optimal sensing may occur-where the angle $\theta$ differs from 45°. Some reasons for this difference in the predicted sensing and the actual sensing may be explained by geometrical effects such as demagnetizing fields and the actual magnetic field being non-radial due to perturbations of the ferromagnetic object or target.

Figure 7:
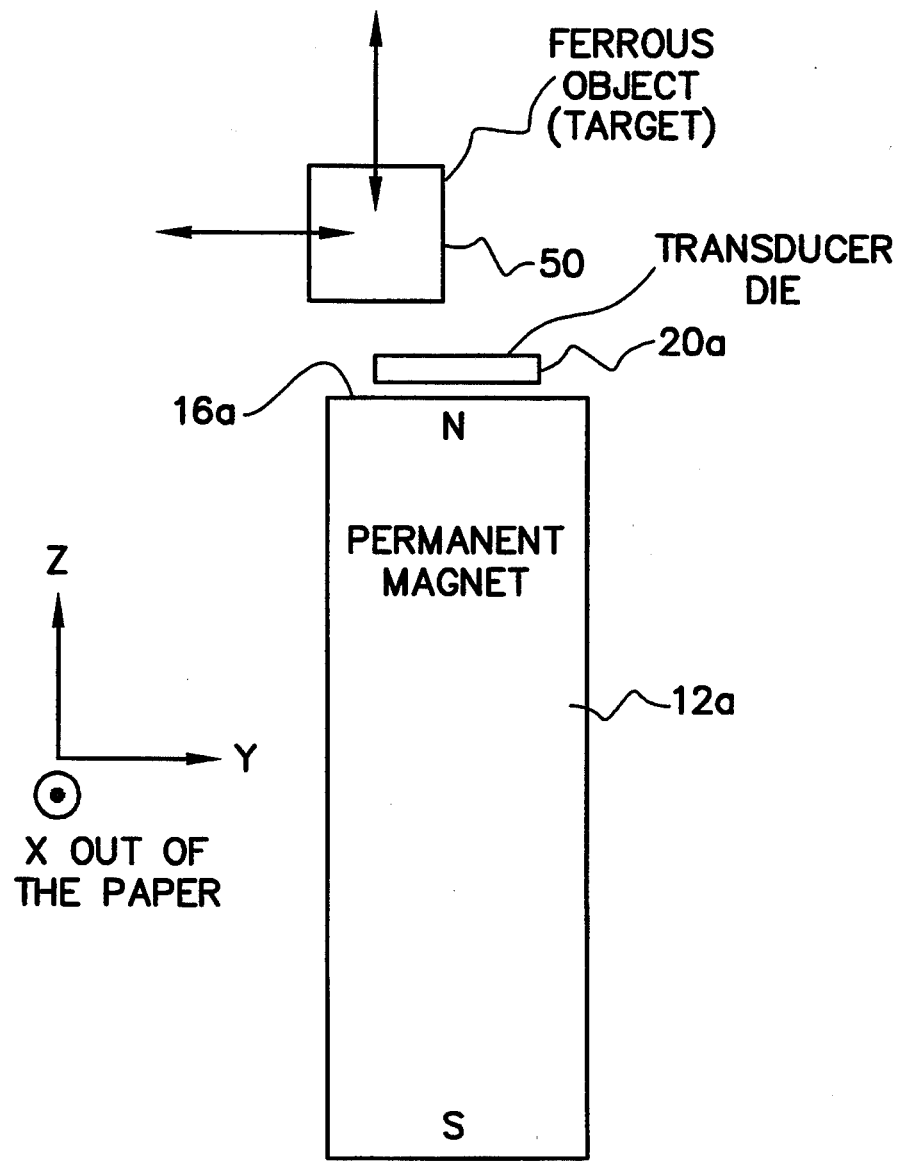
FIG. 7 shows an implementation of the present invention for proximity sensing of a ferrous object.

FIG. 7 illustrates a non-gear tooth proximity sensor in accordance with the principles of the present invention including a permanent magnet 12a having an end or pole face 16a. The apparatus of FIG. 7 is intended for use with a ferrous object or target 50 having possible motions in three axis as illustrated. Transducer die 20a is located in the radial field produced by magnet 12a.

Now that the basic construction and operation of apparatus 10 have been set forth, certain advantages can be further set forth and appreciated. In the past, the voltage output of many proximity sensors used in gear tooth sensing applications has been dependent on the frequency at which the gear teeth pass the sensor. This resulted in low output voltage levels at low gear speeds. The voltage output of the bridge 30 disclosed herein is independent of the frequency of modulation, e.g., the frequency at which gear teeth pass the sensor. The invention described herein provides a uniform output signal for any frequency of modulation. This feature allows the use of apparatus 10 at very low speeds that is at speeds approaching zero. These so called zero speed sensors are needed for automotive applications.

According to the teachings of the present invention, radial magnetic field 26 causes magnetoresistive elements 35 to be magnetically saturated. An advantage of operating in a saturated condition is there is no temperature dependence as there would be if the elements 35 were not saturated.

The magnetoresistive transducer of the present invention may be combined with a variety of electronics approaches. These include the combination of a magnetoresistive transducer and support electronics in a fully integrated die form, or in a hybrid chip form or with the transducer and the electronics as a separate components. Bipolar or MOS technology, and bulk or silicon on insulator (SOI) based electronics may be used. In combination with SOI electronics the present invention is expected to be functional well above 250° Celsius.

The present invention provides a bipolar output voltage as the gear teeth successively move past transducer 20. The shape of this output voltage will depend upon the magnetic design details of both the sensor and the gear teeth. Thus, the sensor may be designed to provide a specific output waveform for a particular application.

In addition, in various past systems, the low level of output voltage available from Hall type or magnetoresistive type proximity sensors has created problems. The voltage output of the present invention is expected to be much larger in gear tooth sensing applications than in the past Hall type or magnetoresistive type sensors.

In accordance with the foregoing description, Applicant has developed a proximity sensor that can be easily incorporated into gear tooth position sensing and other applications. Although a specific embodiment of Applicant's invention has been shown and described for illustrative purposes, a number of variations and modifications will be apparent to those of ordinary skill in the relevant arts. It is not intended that coverage be limited to the disclosed embodiments, but only by the terms of the following claims.

I claim:

1. Apparatus for detecting the position of a ferromagnetic object, comprising:

a magnetic field source having an end and an axis, said magnetic field source producing a radial magnetic field component in a direction perpendicular to said axis, said magnetic field component having an effective center from which said radial magnetic field component emanates, said effective center having a location;

a magnetoresistive transducer lying in a plane perpendicular to said axis and interposed between said end of said magnetic field source and said ferromagnetic object, said position of said ferromagnetic object determining said location of said effective center of said radial magnetic field component and said magnetoresistive transducer being responsive to said location of said effective center, said magnetoresistive transducer comprising a first bridge leg, a second bridge leg, and additional bridge components, said first and second bridge legs each having at least one magnetoresistive strip electrically connected to said additional bridge components to form an electrical bridge circuit, said radial magnetic field having an angle of intersection with said at least one magnetoresistive strip and said at least one magnetoresistive strip being curved to provide a predetermined value for said angle of intersection with segments of said at least one magnetoresistive strips for said balanced bridge condition, with said first and second bridge legs arranged within said transducer to provide a balanced bridge condition when said first and second bridge legs are symmetrically positioned relative to said effective center, with said bridge circuit having an output representative of said location of said effective center of said radial magnetic field component.

2. Apparatus of claim 1 wherein said first bridge leg and said second bridge leg each comprise a plurality of magnetoresistive strips with each strip located approximately parallel to an adjacent strip and each strip electrically connected to an adjacent strip to form a series string of said plurality of strips.

3. Apparatus of claim 1 wherein said angle of intersection has a value of approximately 45 degrees.

4. Apparatus of claim 2 wherein said angle of intersection has a value of approximately 45 degrees.

5. Apparatus of claim 2 wherein said ferromagnetic object is a geartooth and said output has a first polarity as said gear tooth moves toward said magnetic field source axis and an opposite polarity as said geartooth moves away from said magnetic field source axis.

6. Apparatus of claim 5 wherein said magnetic field source is a permanent magnet having a tapered portion at said end, said tapered portion going from a larger cross section to a smaller cross section in a direction toward said end.

7. Apparatus for detecting the position of a ferromagnetic object, comprising:
a magnetic field source having an end and an axis, said magnetic field source producing a radial magnetic field component in a direction perpendicular to said axis, said magnetic field component having an effective center from which said radial magnetic field component emanates, said effective center having a location;
a magnetoresistive transducer lying in said radial magnetic field component, said magnetoresistive transducer including a first element having a first resistance and carrying a first current in a first direction and a second element having a second resistance and carrying a second current in a second direction, each of said elements substantially saturated by said radial magnetic field, each of said elements having a direction of magnetization aligned with said radial magnetic field, with said direction of magnetization and said direction of said first current forming a first angle and said direction of magnetization and said direction of said second current forming a second angle, with said position of said ferromagnetic object causing changes in said first angle and said second angle;
said first and second elements each having a resistance wherein the resistance R of either said element can be $R_o$, determined by the relationship $$R = R_o + \Delta R \cos^2 \theta$$

where $\theta$ is the angle between a magnetization vector in said magnetoresistive element due to said radial magnetic field and a direction of a current flow in said magnetoresistive element;

$\Delta R$ is the amount of resistance change as said magnetization vector is rotated from being parallel to said element to being perpendicular to said element;

$R_o$ is the resistance of said magnetoresistive element when $\theta$ is 90 degrees; and said first and second magnetoresistive elements electrically connected to additional bridge components to form a bridge circuit, said bridge circuit having an output related to said location of said effective center and to a change in said angle $\theta$ for said first element and a change in said angle $\theta$ for said second element.

8. Apparatus of claim 7 wherein said first bridge leg and said second bridge leg each comprise a plurality of magnetoresistive strips with each strip located approximately parallel to an adjacent strip and each strip electrically connected to an adjacent strip to form a series string of said plurality of strips.

9. Apparatus of claim 8 wherein said radial magnetic field has an angle of intersection with said magnetoresistive strips said angle of intersection having a value, and said magnetoresistive strips are curved to provide a predetermined value for said angle of intersection for a balanced bridge condition.

10. Apparatus of claim 9 wherein said ferromagnetic object is a geartooth and said output has a first polarity as said gear tooth moves toward said magnetic field source axis and an opposite polarity as said geartooth moves away form said magnetic field source axis.

* * * * *